(12) United States Patent
Coronato et al.

(10) Patent No.: US 8,565,452 B2
(45) Date of Patent: Oct. 22, 2013

(54) INTEGRATED ACOUSTIC TRANSDUCER IN MEMS TECHNOLOGY, AND MANUFACTURING PROCESS THEREOF

(75) Inventors: Luca Coronato, Corsico (IT); Sarah Zerbini, Cornaredo (IT); Angelo Antonio Merassi, Vigevano (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 892 days.

(21) Appl. No.: 12/644,846

(22) Filed: Dec. 22, 2009

(65) Prior Publication Data

US 2010/0158280 A1 Jun. 24, 2010

(30) Foreign Application Priority Data

Dec. 23, 2008 (IT) ................ TO2008A0982

(51) Int. Cl.
*H04R 25/00* (2006.01)
*H04R 9/08* (2006.01)
*H04R 11/04* (2006.01)
*H04R 17/02* (2006.01)
*H04R 19/04* (2006.01)
*H04R 21/02* (2006.01)
*H04R 1/00* (2006.01)
*H04R 9/06* (2006.01)
*H04R 11/02* (2006.01)

(52) U.S. Cl.
USPC ............ 381/174; 381/191; 381/369; 381/423

(58) Field of Classification Search
USPC ......... 381/113, 174, 175, 191, 355, 369, 416, 381/423; 361/283.4; 438/53; 257/416
See application file for complete search history.

(56) References Cited

U.S. PATENT DOCUMENTS

| | | | |
|---|---|---|---|
| 5,517,683 A | * | 5/1996 | Collett et al. ............. 455/575.1 |
| 2002/0067663 A1 | | 6/2002 | Loeppert et al. |
| 2007/0201710 A1 | * | 8/2007 | Suzuki et al. ................. 381/174 |

FOREIGN PATENT DOCUMENTS

| | | |
|---|---|---|
| EP | 1892999 A2 | 2/2008 |
| FR | 2884101 A1 | 10/2006 |
| WO | 2006/123263 A1 | 11/2006 |
| WO | 2008/103672 A2 | 8/2008 |

* cited by examiner

*Primary Examiner* — Duc Nguyen
*Assistant Examiner* — Matthew Eason
(74) *Attorney, Agent, or Firm* — Seed IP Law Group PLLC (57) ABSTRACT

A MEMS acoustic transducer, for example, a microphone, includes a substrate provided with a cavity, a supporting structure, fixed to the substrate, a membrane having a perimetral edge and a centroid, suspended above the cavity and fixed to the substrate the membrane configured to oscillate via the supporting structure. The supporting structure includes a plurality of anchorage elements fixed to the membrane, and each anchorage element is coupled to a respective portion of the membrane between the centroid and the perimetral edge of the membrane.

18 Claims, 9 Drawing Sheets

INTEGRATED ACOUSTIC TRANSDUCER IN MEMS TECHNOLOGY, AND MANUFACTURING PROCESS THEREOF

BACKGROUND

1. Technical Field

The present disclosure relates to an integrated acoustic transducer in MEMS technology and to the manufacturing process, and in particular to a microelectromechanical (MEMS) microphone of a capacitive type with a suspended-membrane mobile electrode and reduced residual stresses.

2. Description of the Related Art

As is known, an acoustic transducer, for example, a MEMS microphone, of a capacitive type generally comprises a mobile electrode, in the form of a diaphragm or membrane, arranged facing a fixed electrode, to provide the plates of a capacitor. The mobile electrode is generally anchored, by means of a perimetral portion, to a substrate, while a central portion is free to move or bend in response to a sound-wave pressure acting on a surface of the mobile electrode. Since the mobile electrode and the fixed electrode form the capacitor, bending of the membrane that constitutes the mobile electrode causes a variation of capacitance of the capacitor. In use, said variation of capacitance is converted into an electrical signal, supplied as an output signal of the MEMS microphone.

As an alternative to MEMS microphones of a capacitive type, MEMS microphones are known, in which the movement of the membrane is detected by means of elements of a piezoresistive, piezoelectric, or optical type, or also exploiting the tunnel effect.

MEMS microphones of a known type are, however, subject to problems deriving from residual (compressive or tensile) stresses internal to the layer that forms the membrane. The factors that affect stress are multiple, and are due, for example, to the properties of the materials used, to the techniques of deposition of said materials, to the conditions (temperature, pressure, etc.) at which deposition is made, and to possible subsequent thermal treatments.

Residual stresses are frequently the cause of mechanical deformations of the membrane, such as warping or buckling, and can significantly affect the performance of the MEMS microphone by reducing the sensitivity.

Even though it is possible to control partially the amount of residual stress in the membrane by means of an appropriate design of the membrane itself and by evaluating the optimal manufacturing conditions, the result obtained is not satisfactory for applications in which a high sensitivity is required. In these cases, in fact, the mechanical behavior in response to sound-wave stresses is in any case dominated by the level of residual stress in the membrane.

To overcome these problems, described in WO 2008/103672 is a MEMS microphone of a capacitive type in which the mobile electrode (with membrane of a circular shape) is suspended over a cavity by means of a single anchorage element fixed with respect to a supporting beam provided in the same layer in which the fixed electrode is formed. The point of coupling of the anchorage element with the mobile electrode is located in the center of the membrane that forms the mobile electrode. In this way, the mobile electrode can release the residual stresses through free radial contractions or expansions.

However, membrane mobile electrodes suspended to the fixed electrode by means of a central anchorage are readily susceptible, during use, to undesirable modes of pitch and roll, which cause a degradation of the performance of the MEMS microphone that uses said mobile electrodes.

BRIEF SUMMARY

The present disclosure is to provide an integrated acoustic transducer in MEMS technology and a manufacturing process.

One embodiment of the present disclosure is a MEMS acoustic transducer that includes a substrate having a cavity, a supporting structure fixed to the substrate; and a membrane having a perimetral edge and a centroid. The membrane is suspended above the cavity and fixed to the substrate and configured to oscillate through the supporting structure, wherein the supporting structure comprises a plurality of anchorage elements fixed to the membrane, each anchorage element being coupled to a respective portion of the membrane between the centroid and the perimetral edge of the membrane.

BRIEF DESCRIPTION OF THE SEVERAL VIEWS OF THE DRAWINGS

For a better understanding of the present disclosure, embodiments are now described, purely by way of non-limiting example, with reference to the attached drawings, wherein.

DETAILED DESCRIPTION

Figure 1:
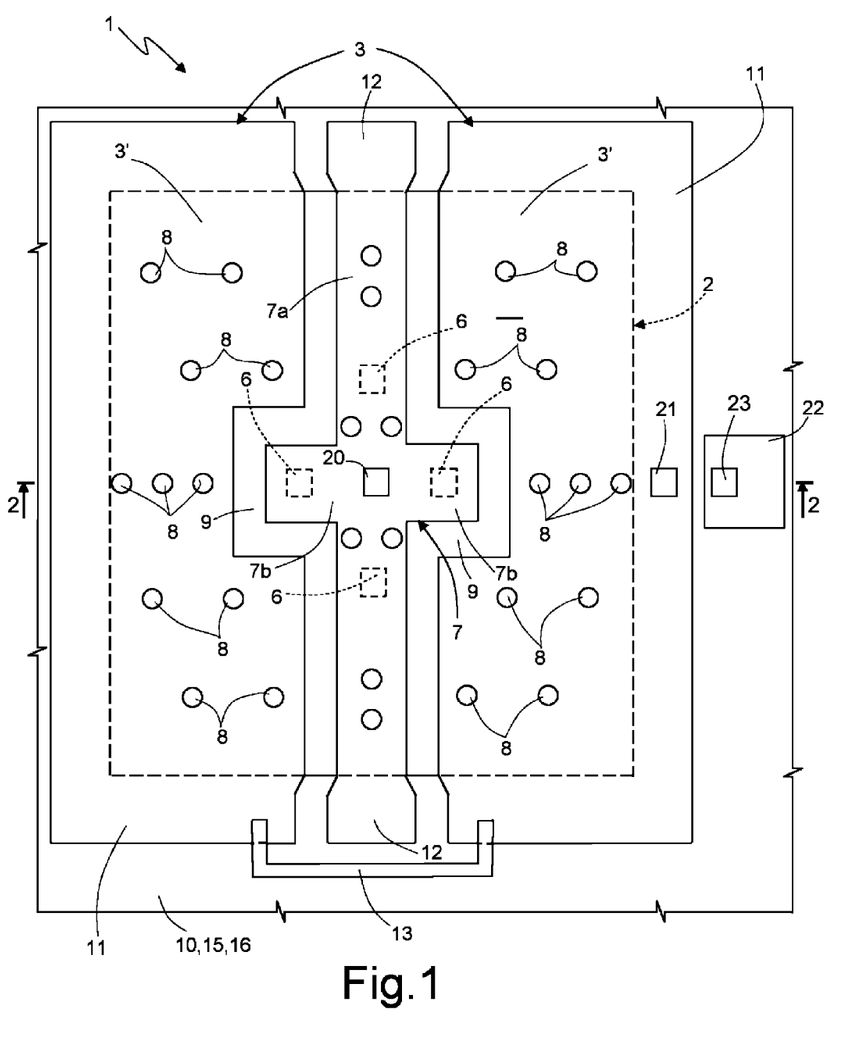
FIG. 1 shows a top plan view of an assemblage of a rigid plate of an acoustic transducer according to one embodiment of the present disclosure.
Figure 2:
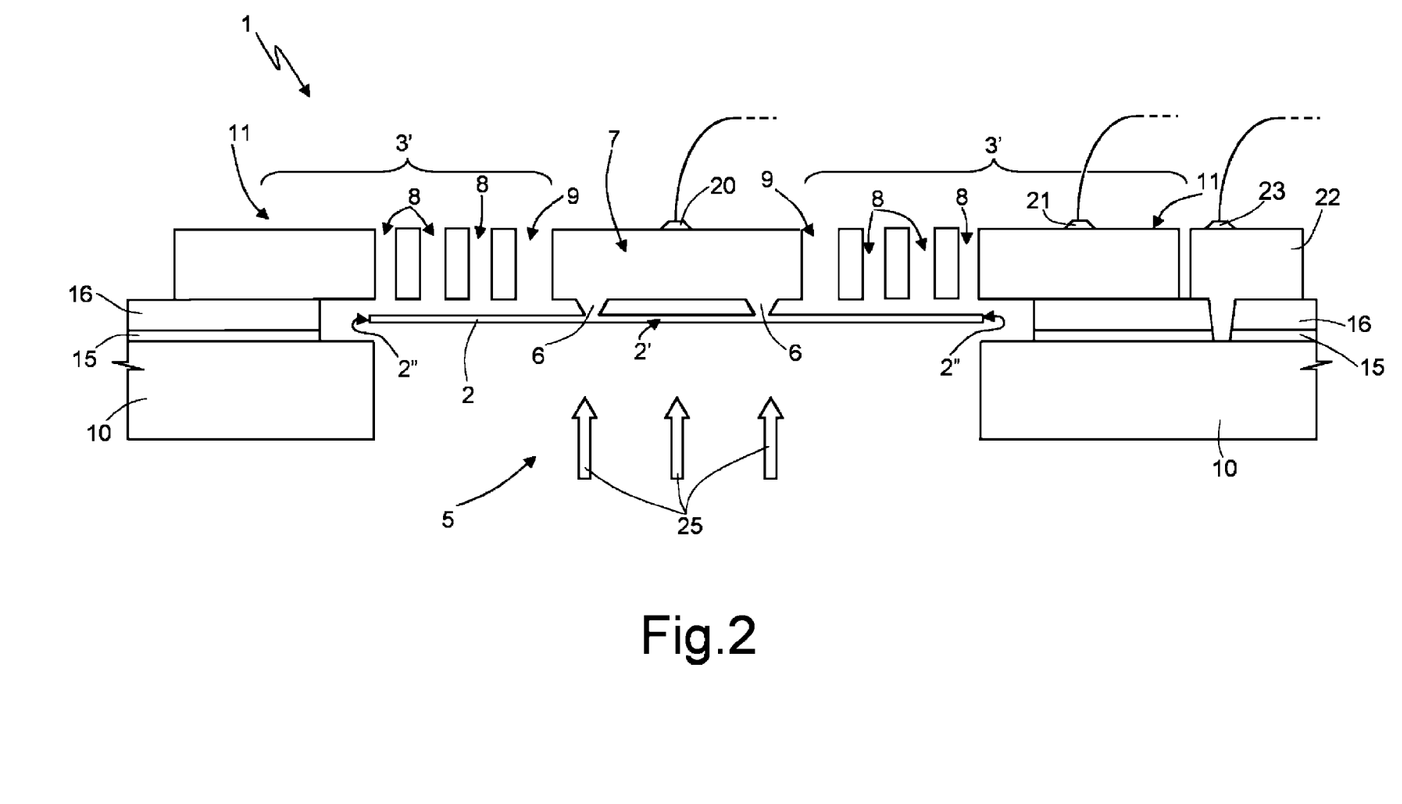
FIG. 2 shows a cross-sectional view of an assemblage of a rigid plate and a mobile membrane of the acoustic transducer of FIG. 1, along a line of cross section II-II of FIG. 1.

FIGS. 1 and 2 show, respectively, a top plan view and a cross-sectional view of an assemblage of a membrane and a rigid plate of an integrated acoustic transducer in MEMS technology, for example, a microelectromechanical (MEMS) microphone, according to one embodiment of the present disclosure. For reasons of simplicity, in what follows reference will be made to said assemblage generally as a MEMS microphone 1, even though the electronics of supply and conditioning of the signals, which are, however, necessary, are not illustrated, and even though the description, albeit valid for any acoustic transducer, is limited in particular to a microphone.

With joint reference to FIGS. 1 and 2, the MEMS microphone 1 is a microphone of a capacitive type and comprises a membrane 2, which is mobile and faces a rigid plate 3 (back plate), which is fixed. The membrane 2 is suspended above a cavity 5 and is supported by one or more supporting beams 7 (only one of which is shown in the figure) via a plurality of supporting elements 6, coupled to a respective portion of the membrane 2 comprised between the center 2' and a perimetral edge 2" of the membrane 2. As may be seen in FIG. 1, the supporting beam 7 may comprise a beam-bearing portion 7a and a plurality of beam-appendage portions 7b, fixed with respect to the beam-bearing portion 7a. The supporting elements 6 can be provided either between the beam-appendage portions 7b and the membrane 2 or between the beam-bearing portion 7a and the membrane 2. Preferably, the supporting beam 7 is formed in the same layer in which the rigid plate 3 is formed and is separated from the rigid plate 3 by means of a notch 9, formed, for example, by means of techniques of chemical etching. In this way, the rigid plate 3 is divided by the supporting beam 7 into two rigid-plate regions 3', which are lateral with respect to the supporting beam 7 itself. The two rigid-plate regions 3' can be electrically connected to one another, for example, by means of a connection path 13, made of conductive material.

Furthermore, the rigid plate 3, the supporting beam 7, the supporting elements 6, and the membrane 2 are advantageously made of the same conductive material, for example, doped polysilicon, thus simplifying the manufacturing process and eliminating any possible problems due to non-adhesion of the supporting elements 6 to the supporting beam 7 and to the diaphragm 2.

The rigid plate 3 can comprise a plurality of holes 8, of any path, preferably circular, having the function of favoring, during the manufacturing steps, removal of underlying layers (as will be explained more clearly in what follows) and, in use, of enabling free circulation of air between the rigid plate 3 and the membrane 2, thus reducing the effect of squeeze-film damping. For the same reasons, also the supporting beam 7 can comprise a plurality of holes 8.

The rigid plate 3 and the supporting beam 7 are anchored to a substrate 10 via respective plate-anchorage portions 11 and beam-anchorage portions 12.

The plate-anchorage portions 11 preferably comprise peripheral areas of the rigid plate 3, which include, for example, an entire boundary of the rigid plate 3, and are insulated from the substrate 10 by one or more insulating layers, for example, as illustrated in FIG. 2, by a first insulating layer 15 and by a second insulating layer 16. In addition to the function of insulation of the substrate 10 from the rigid plate 3, the first and second insulating layers 15, 16 have, respectively, the function, during the manufacturing steps, of separating the membrane 2 from the substrate 10, and of enabling separation between the rigid plate 3 and the membrane 2.

The beam-anchorage portions 12 preferably comprise two or more mutually opposite sides of the supporting beam 7 and are separated from the substrate 10 by one or more insulating layers, for example, by the first insulating layer 15 and by the second insulating layer 16, in a way similar to what is illustrated with reference to the plate-anchorage portions 11.

The supporting beam 7 and the membrane 2 are mechanically and electrically connected to one another via the supporting elements 6, and insulated from the rigid plate 3. Consequently, the membrane 2 and the rigid plate 3 form plates of a capacitor, and the air that flows between the membrane 2 and the rigid plate 3 through the holes 8 forms the dielectric arranged between the electrodes of the capacitor. In order to implement the operations of a microphone of a capacitive type, the rigid plate 3 and the membrane 2 must be appropriately biased, while the substrate 10 supplies a ground reference signal. For this purpose, there are provided: a first pad 20, made of conductive material and in electrical contact with the membrane 2, preferably placed on the supporting beam 7 for biasing the membrane 2 itself; a second pad 21, made of conductive material, placed in direct contact with the rigid plate 3, for biasing the rigid plate 3 itself; and a third pad 23, also made of conductive material, placed in electrical contact with a ground contact 22, which is, in turn, in direct contact with the substrate 10, for collecting the ground reference signal.

In use, the cavity 5 has the function of acoustic input port, to enable sound-pressure waves 25, represented schematically in the figure as arrows, to enter and dynamically deform the membrane 2. As an alternative, in a way not shown in the figure, the sound-pressure waves 25 can reach the membrane 2 through the holes 8.

Since the membrane 2 is not anchored along its perimetral edge 2", the residual stresses of the membrane 2 are released through free radial contractions or expansions. Furthermore, thanks to the presence of the plurality of supporting elements 6, the membrane 2 is not very susceptible to detection errors due to undesired modes of pitch and roll.

The respective stiffnesses of the rigid plate 3, of the supporting beam 7, and of the membrane 2 can be used to vary the characteristics of sensitivity of the MEMS microphone 1.

The supporting beam 7 has a thickness greater than that of the membrane 2, for example, it is from three to five times as thick as the membrane 2. In use, the variation of capacitance is caused principally by the deformation of the membrane 2 and the relative displacement of the supporting beam 7 (to which, as has been said, the membrane 2 is anchored) as compared to the rigid plate 3 is negligible.

The MEMS microphone 1 of FIG. 2 is provided according to the process described in what follows and represented in FIGS. 3-8, only as regards one half of the MEMS microphone 1 itself.

Initially (FIG. 3), a first insulating layer 15, for example, silicon oxide having a thickness of between 1 μm and 3 μm, preferably 2.6 μm, is grown on a substrate 10, made, for example, of silicon of a thickness of 500 μm, of a wafer 30. Then, a membrane layer 32, for example, polysilicon, is deposited on the wafer 30 on the first insulation-oxide layer 15. Since, as is described more fully in what follows, the membrane layer 32 will form, at the end of the manufacturing steps, the suspended membrane 2, its thickness must be carefully controlled during the step of deposition to obtain desired values of flexibility and mechanical solidity. For example, the membrane layer 32 can have a thickness of between 0.5 μm and 1.5 μm, preferably 0.9 μm.

Figure 3:
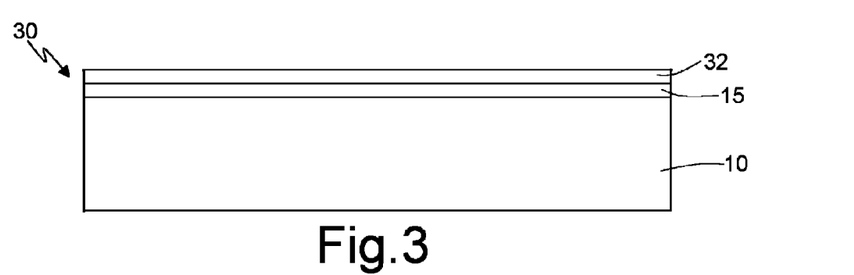
FIGS. 3-8 show a cross-sectional view of one half of the assemblage of FIG. 2 during successive manufacturing steps.

Then, the membrane layer 32 is doped by means of implantation of ion species of an N+ type, to increase the conductivity. A subsequent annealing step, for example, at a temperature of 1050° C. for 90 minutes, favors diffusion and activation of the ion dopant species and the reduction of the tensile stress of the membrane layer 32 at an interface with the first insulating layer 15.

Next (FIG. 4), by means of successive lithography and etching steps, for example, using a dry etch, the membrane layer 32 is selectively removed, with the exception of an area in which it is intended to form the membrane 2.

Then (FIG. 5), a second insulating layer 16, for example, TEOS (tetraethyl orthosilicate) or an oxide having a thickness of between 1 µm and 2 µm, preferably 1.6 µm, is deposited on the wafer 30, densified, and then planarized.

Figure 5:
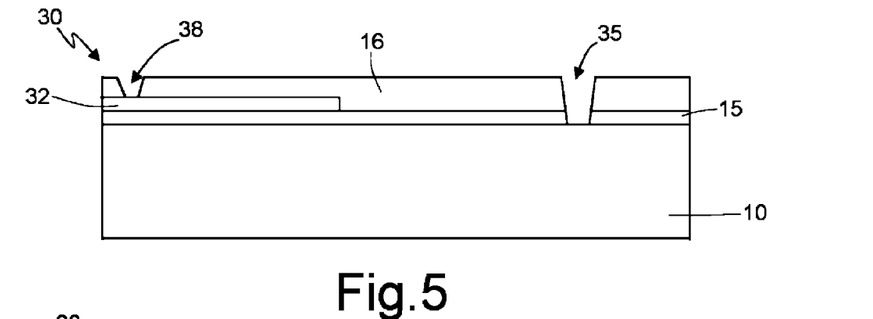

Subsequent lithography and etching steps (for example, wet etching by means of basic oxide etch) of the first insulating layer 15 and of the second insulating layer 16 enable formation of an opening 35 for the ground contact 22.

Next, formed by dry etching are third openings 38 (only one of which is shown in FIG. 5) in the second insulating layer 16, until respective portions of a surface of the membrane layer 32 are reached and exposed. The third openings 38 enable, as described in what follows, formation of the supporting elements 6.

Then (FIG. 6), a rigid-plate layer 39 is formed on the wafer 30, to fill the opening 35 and form a thick layer above it. Advantageously, the rigid-plate layer 39 is constituted by epitaxial polysilicon, of a thickness of between 4 µm and 8 µm, preferably 6 µm. The rigid-plate layer 39 is then planarized, for example, by means of chemical mechanical polishing (CMP), to obtain a final thickness of between 3 µm and 7 µm, preferably 5 µm, whereas a subsequent step of implantation, activation, and diffusion of dopant species of an N+ type, for example, arsenic, enables an increase in the conductivity of the rigid-plate layer 39. The rigid-plate layer 39 is illustrated as merging with the membrane layer 32 to show the electrical communication established via the supporting elements 6.

Figure 6:
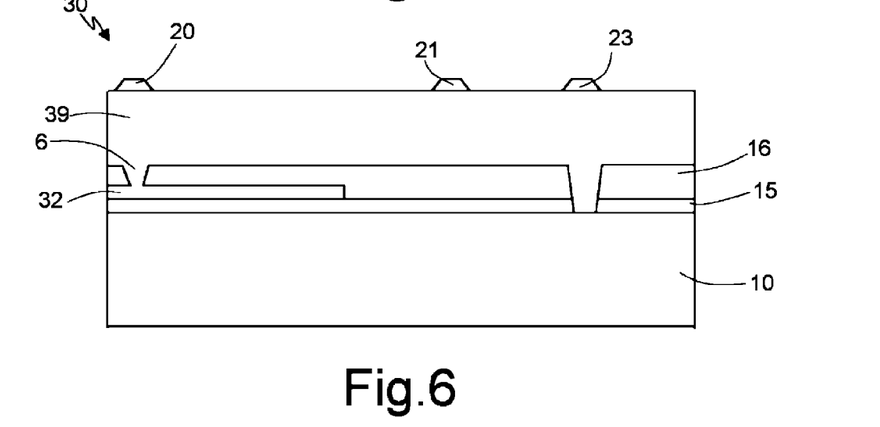
Figure 7:
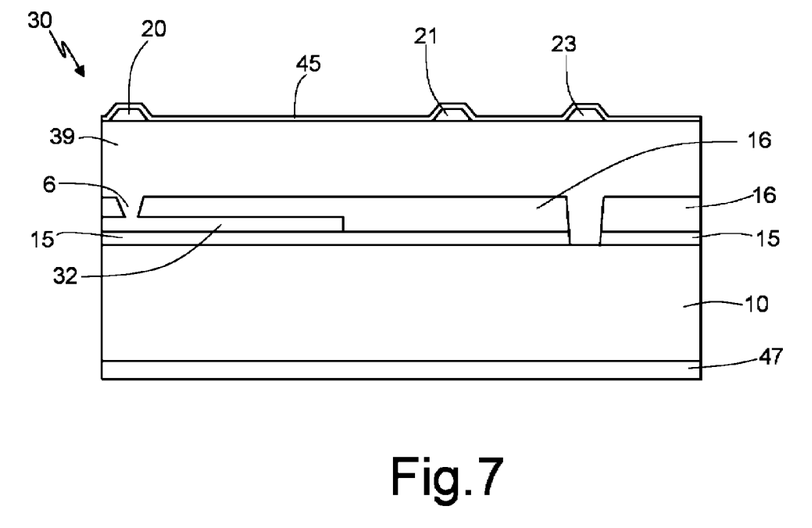

Then, a conductive layer, for example, made of aluminum with a thickness of 0.7 µm, is deposited on the wafer 30 and defined by means of wet etching to form the first, second, and third pads 20, 21, and 23. In the figure, by way of example, the pads 20, 21, 23 are placed on top of, and in direct contact with, the supporting beam 7 and the rigid plate 3. However, it may be advantageous to form the pads 20, 21, 23 in an area of the substrate 10 not occupied by the supporting beam 7 and by the rigid plate 3 (in a way not shown in the figures) and connect them electrically to the latter via conductive paths. Next (FIG. 7), a first mask layer 45, for example, made of SiC (silicon carbide), is deposited on a top surface of the wafer 30, while a second mask layer 47, for example, made of SiN (silicon nitride) and/or SiC, is deposited on a back of the wafer 30.

Figure 8:
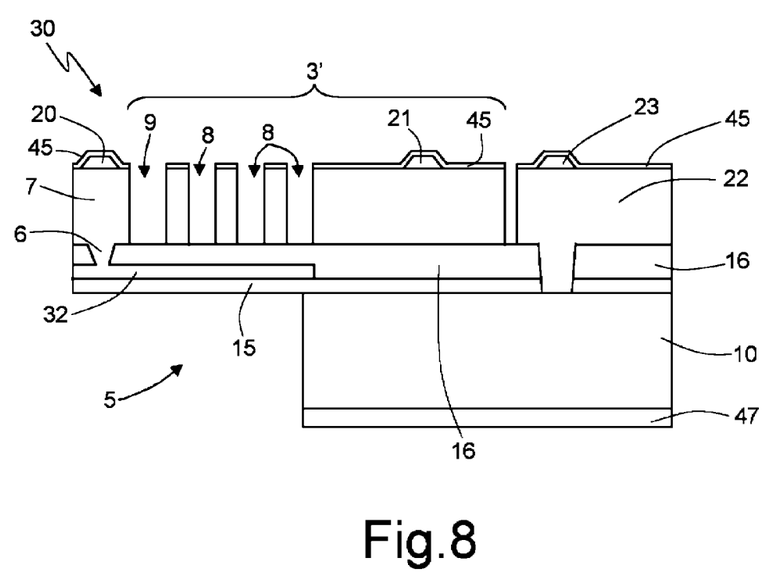

As shown in FIG. 8, the first mask layer 45 is selectively removed to expose portions of the rigid-plate layer 39. A subsequent etching step, for example, dry etching, enables removal of the portions of the exposed rigid-plate layer 39, but not the portions protected by the first mask layer 45. Defined in this way are the rigid plate 3, the supporting beam 7, the holes 8 of the rigid plate 3 and of the supporting beam 7, the notch 9, and the ground contact 22.

Then, the second mask layer 47 is selectively removed so as to leave a portion of the back of the substrate 10 underlying the membrane layer 32 exposed. The substrate 10 is then removed, for example, by means of dry etching of a DRIE (deep reactive ion etching) type, in the portions not protected by the second mask layer 47, to form the cavity 5.

Finally, a wet etch both on the front and on the back of the wafer 30 enables removal of the portions of the first and second insulating layers 15 and 16 surrounding the membrane layer 32, thus leading to formation of the membrane 2, suspended above the cavity 5. The first and second mask layers 45, 47 are then removed, to form the MEMS microphone 1 of FIG. 2.

It is clear that the manufacturing steps described can be used for producing a plurality of MEMS microphones 1 on one and the same wafer 30.

Figure 9:
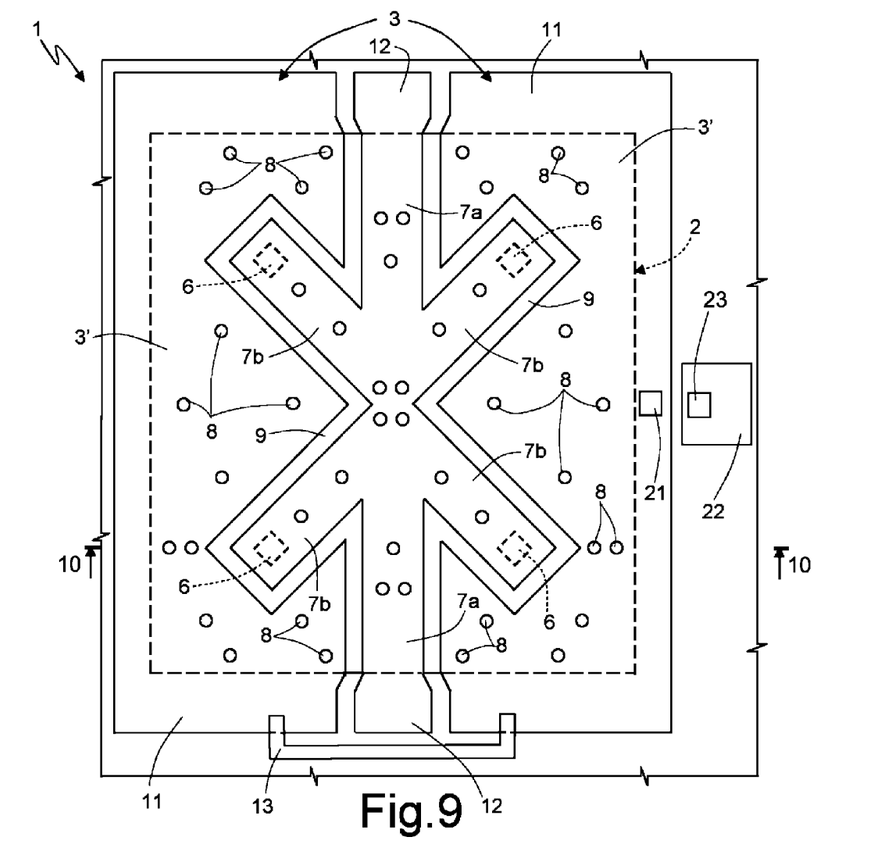
FIG. 9 shows a top plan view of an assemblage of a rigid plate of an acoustic transducer according to another embodiment of the present disclosure.
Figure 10:
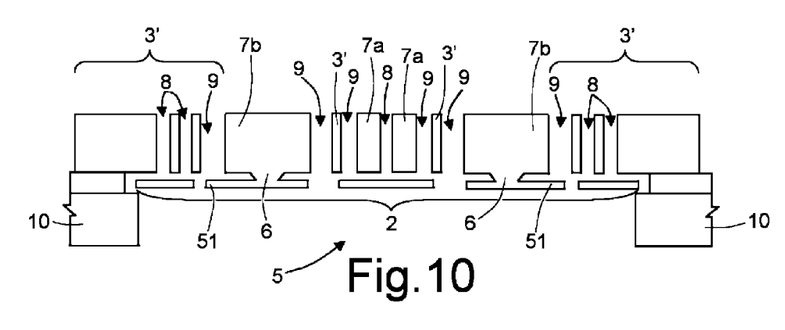
FIG. 10 shows a cross-sectional view of an assemblage of a rigid plate and a mobile membrane of the acoustic transducer of FIG. 9, along a line of cross section X-X of FIG. 9.
Figure 11:
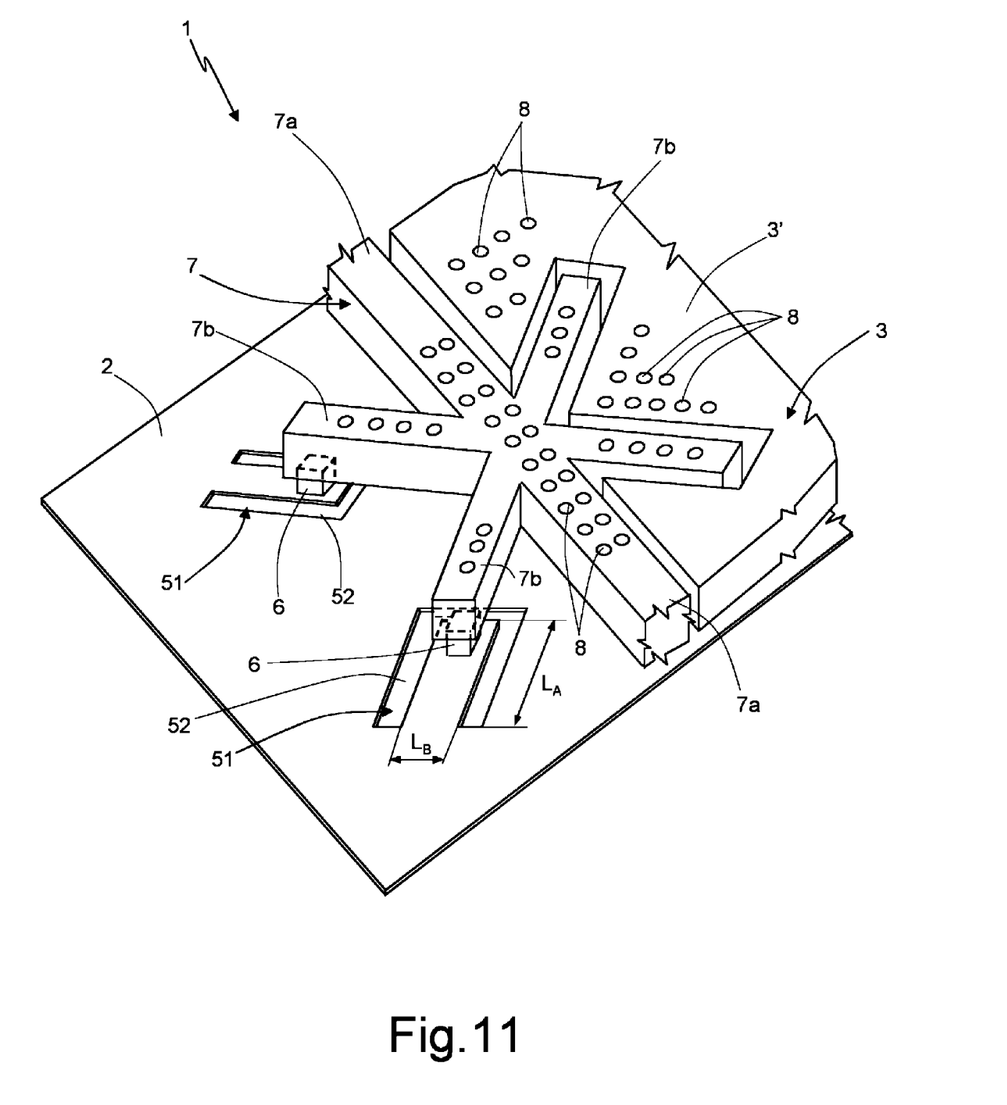
FIG. 11 shows a perspective view of the assemblage of FIG. 10.

FIGS. 9-11 show a MEMS microphone 1 according to a further embodiment. In detail, FIG. 9 shows a top plan view of the MEMS microphone 1, FIG. 10 a cross-sectional view of the MEMS microphone 1 along a cross section X-X of FIG. 9, and FIG. 11 a perspective view of the MEMS microphone 1, all according to said embodiment.

In this case, the MEMS microphone 1 comprises a single supporting beam 7, including a beam-bearing portion 7a anchored to the substrate 10 by means of two beam-anchorage portions 12, and four beam-appendage portions 7b that start from the beam-bearing portion 7a and are X-shaped in top plan view.

The supporting elements 6 are formed, in this case, each on a respective beam-appendage portion 7b.

Figure 4:
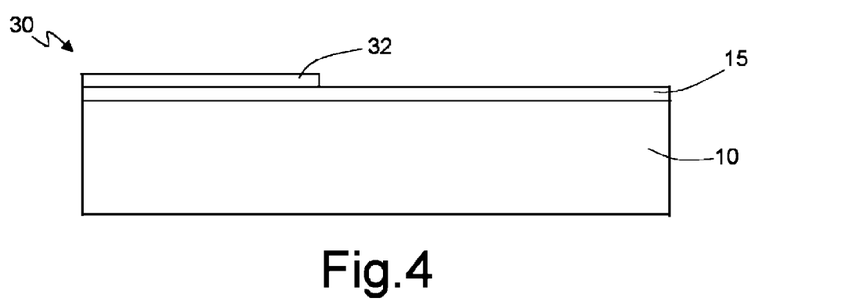

Advantageously, as may be seen in FIG. 11, the supporting elements 6 are coupled to the membrane 2 through springs 51, fixed with respect to the membrane 2 and formed during the step of etching of the membrane layer 32 (FIG. 4).

The springs 51, lying in the same plane in which the membrane 2 lies, can have, for example, an elongated cantilever shape with dimensions of 50-200 µm in length $L_A$, 20-40 µm in width $L_B$, and with a thickness equal to the thickness of the membrane 2. More precisely, the springs 51 are made by notching the membrane 2. In this way, each spring 51 is surrounded by the membrane 2, from which it is partially separated by a trench 52, obtained using techniques of micromachining of a known type.

The springs 51 have the dual function of bestowing upon the membrane 2 a greater flexibility for movements orthogonal to the plane in which the membrane 2 itself lies, and further releasing the residual stresses of the membrane 2 deriving from the manufacturing process and from anchorage to the supporting beam 7, thus enabling free radial contractions or expansions (in the plane in which the membrane 2 lies) also in the proximity of the points of connection with the supporting elements 6, thanks to the presence of the trench 52.

In order to optimize release of residual stresses of the membrane 2 and the stability of oscillation of the membrane 2 during use, the points of anchorage of the supporting elements 6 to the membrane 2, via the respective spring 51, are preferably positioned at a distance from the center of the membrane 2 preferably equal to $d/(2 \cdot \sqrt{2})$, where d is the diagonal of the membrane 2 (which joins two opposite vertices of the membrane 2 in the case of the quadrangular membrane shown in the figure).

Figure 12:
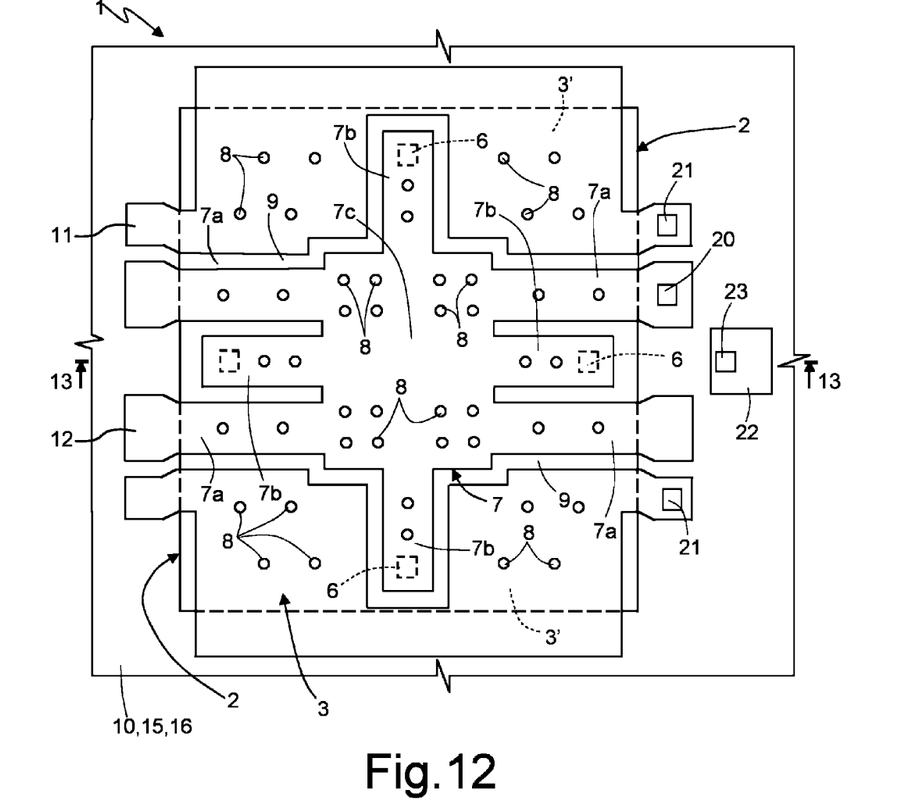
FIG. 12 shows a top plan view of an assemblage of a rigid plate of an acoustic transducer according to a further embodiment of the present disclosure.
Figure 13:
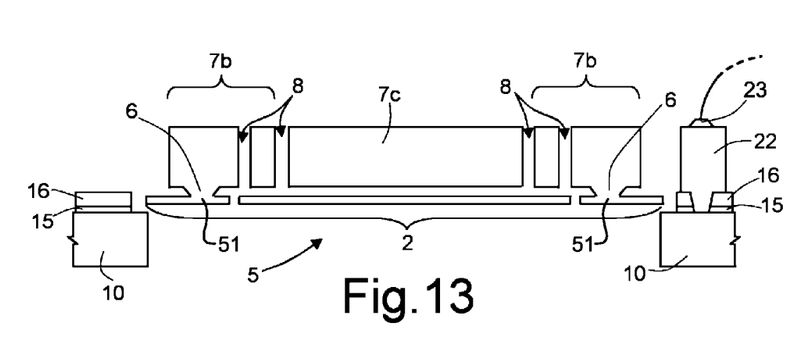
FIG. 13 shows a cross-sectional view of an assemblage of a rigid plate and a mobile membrane of the acoustic transducer of FIG. 12, along a line of cross section XIII-XIII of FIG. 12.
Figure 14:
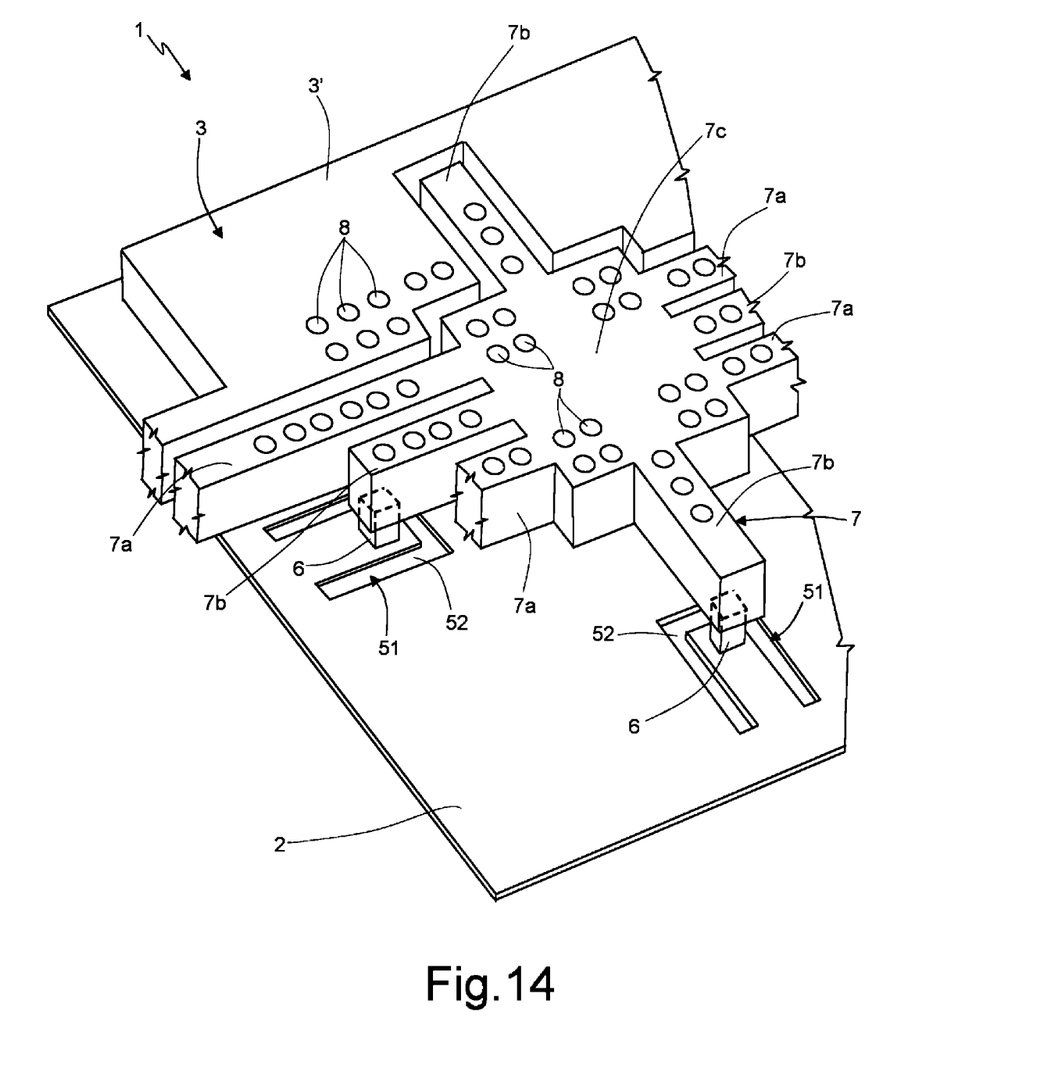
FIG. 14 shows a perspective view of the assemblage of FIG. 13.

FIGS. 12-14 show a MEMS microphone 1 according to another embodiment. In greater detail, FIG. 12 shows a top plan view of the MEMS microphone 1, FIG. 13 a cross-sectional view of the MEMS microphone 1 along a cross section XIII-XIII of FIG. 12, and FIG. 14 is a perspective view of the MEMS microphone 1, all according to the present embodiment.

As shown in FIGS. 12-14, the MEMS microphone 1 comprises, according to the present embodiment, a supporting beam 7 formed by a plurality of beam-bearing portions 7a (for example four as shown in FIG. 12) and by a central beam portion 7c. The beam-bearing portions 7a depart, in pairs, on opposite sides of the central portion 7c, and are anchored to the substrate by means of respective beam-anchorage portions 12. The central beam portion 7c has, for example, a quadrangular shape, and moreover carries a plurality of beam-appendage portions 7b. In the figures, four beam-appendage portions 7b are shown, which extend each on a respective side of the central beam portion 7c and each of which comprises a supporting element 6 coupled to the membrane 2.

The plate-anchorage portions 11 of the rigid plate 3, according to this embodiment, do not comprise the entire boundary of the rigid plate 3, but are provided by rigid-plate appendages 3 that are similar, as regards shape and dimensions, to the beam-bearing portions 7a, albeit of smaller length than the latter. Furthermore, the points of anchorage to the substrate 10 of the plate-anchorage portions 11 and of the beam-anchorage portions 12 are located at a short distance from one another. In this way, stresses external to the MEMS microphone 1 (for example, if the MEMS microphone 1 is inserted within a package, a deflection of the package itself) will cause a deflection or displacement of the rigid plate 3 and of the supporting beam 7 (and hence of the membrane 2) of approximately equal amount, thus rendering the functions of the MEMS microphone 1 less affected by this type of external stress.

With reference to FIGS. 13 and 14, advantageously also in this embodiment, the supporting elements 6 are anchored to the membrane 2 through springs 51, fixed with respect to the membrane 2 and similar to the springs 51 described with reference to FIGS. 10 and 11.

As already discussed with reference to the embodiment of FIG. 1, the first, second, and third pads 20, 21, and 23 are arranged by way of example.

In particular, shown in FIG. 12 are two second pads 21, each connected to a respective rigid-plate region 3', for biasing it and/or collecting a signal thereof during use. As an alternative, the two rigid-plate regions 3' can be electrically connected to one another by means of a conductive path; in this latter case, just one second pad 21 would be necessary, electrically connected to just one of the two rigid-plate regions 3'.

Figure 15:
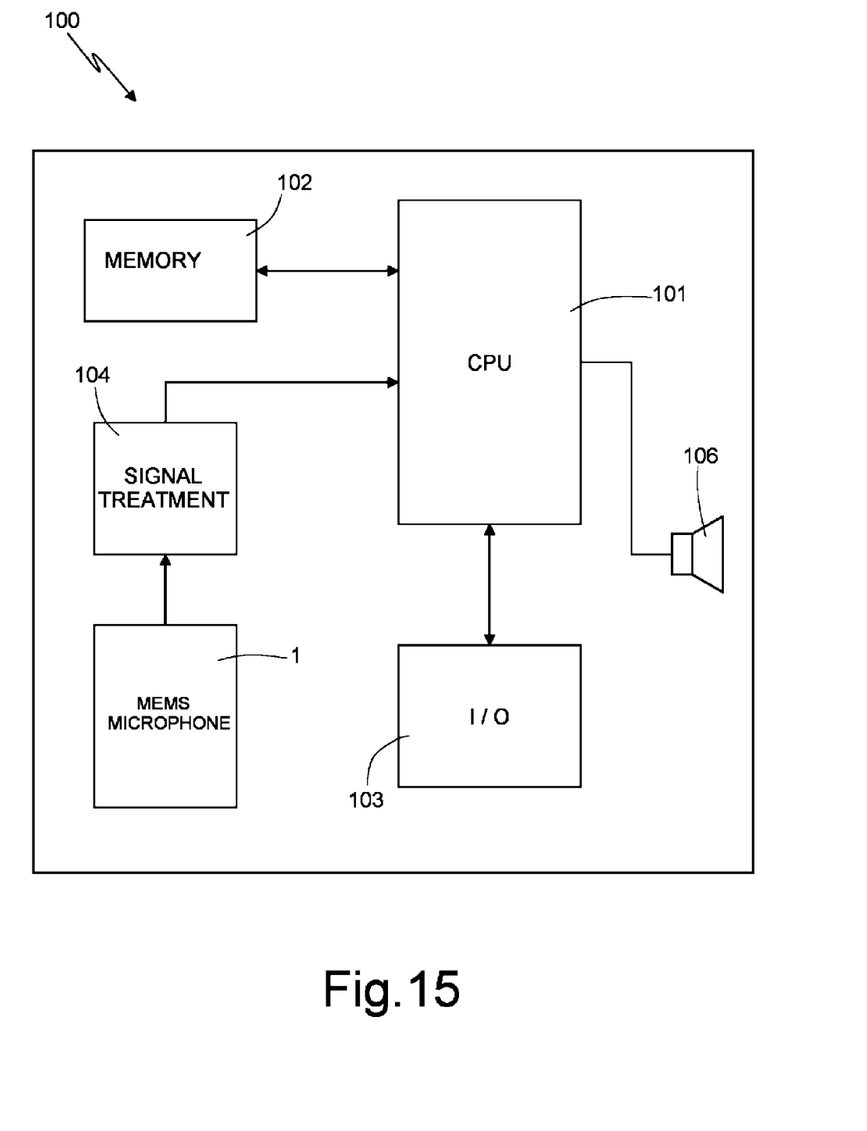
FIG. 15 shows a device that uses an acoustic transducer according to one of the embodiments of the present disclosure.

FIG. 15 shows an electronic device 100 that uses one or more MEMS microphones 1 (just one MEMS microphone 1 is shown in the figure).

The electronic device 100 moreover comprises a microprocessor 101, a memory block 102, connected to the microprocessor 101, and an input/output interface 103, for example, a keyboard and a video, also connected to the microprocessor 101. The MEMS microphone 1 communicates with the microprocessor 101 via a signal-treatment block 104, for example, an amplifier. Furthermore, there may be present a loudspeaker 106, for generating a sound on an audio output (not shown) of the electronic device 100.

The electronic device 100 is preferably a mobile-communication device, such as a cell phone, a PDA, a notebook, a voice recorder, a reader of audio files with voice-recording capacity. Alternatively, the electronic device 100 can be a hydrophone, capable of working under water.

Finally, it is clear that modifications and variations may be made to the MEMS microphone described and illustrated herein, without departing from the sphere of protection of the present disclosure.

For instance, the membrane 2 and the rigid plate 3 can have a shape different from the quadrangular one; for example, they may have a circular or polygonal shape according to the design.

In the same way, the supporting beam 7 can have a shape different from the one shown and described with reference to FIGS. 1, 2, and 9-14. For instance, it may comprise just one beam-bearing portion 7a having a cantilever shape, anchored to the substrate by means of just one beam-anchorage portion 12 or, instead, can comprise a plurality of beam-bearing portions 7a, even separate from one another, and can comprise any number of beam-appendage portions 7b. The supporting elements 6 can be arranged in any way and in any number between the supporting beam 7 and the membrane 2.

Furthermore, according to any embodiment, the membrane 2 can comprise springs 51 of any shape and size, irrespective of the shape of the supporting beam 7 and of the membrane 2.

Finally, it is clear that the rigid plate 3, the membrane 2, and the supporting elements 6 can be made of any conductive material different from doped polysilicon, for example, gold or aluminum.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A MEMS acoustic transducer, comprising:
   a substrate having a cavity;
   a supporting structure, fixed to said substrate, the supporting structure including:
      a plurality of anchorage elements; and
      a main region;
   a membrane having a perimetral edge and a centroid, said membrane being suspended above said cavity and fixed to said substrate, the membrane configured to oscillate through said supporting structure, the plurality of anchorage elements being fixed to said membrane, each anchorage element being coupled to a portion of said membrane positioned between the centroid and the perimetral edge of said membrane; and
   an electrode coplanar to the main region, arranged at a distance from the membrane, and electrically and mechanically separate from the main region, the electrode including a plurality of electrode portions mechanically separated from one another.

2. The MEMS acoustic transducer according to claim 1 wherein said main region is suspended above the cavity and includes a first anchorage structure fixed to the substrate.

3. The MEMS acoustic transducer according to claim 1 wherein said main region includes at least one peripheral portion fixed to the substrate, a suspended portion, and a plurality of appendage portions extending from said suspended portion, each of the anchorage elements being coupled to an appendage portion.

4. The MEMS acoustic transducer according to claim 3 wherein said electrode comprises a peripheral portion anchored to the substrate, said peripheral portion of the electrode being arranged in the proximity of said peripheral portion of the supporting structure.

5. The MEMS acoustic transducer according to claim 1 wherein said membrane comprises a spring element for each anchorage element, said spring elements being coplanar to said membrane and partially separated from said membrane by a trench.

6. The MEMS acoustic transducer according to claim 1 wherein said membrane and said electrode are made of conductive material and face one another to form a capacitor.

7. An electronic device, comprising:
a microprocessor;
a memory coupled to the microprocessor;
a signal treatment processor, coupled to the microprocessor; and
a MEMS acoustic transducer coupled to the signal treatment processor, the MEMS acoustic transducer comprising:
a substrate having a cavity;
a supporting structure, fixed to said substrate, the supporting structure including a plurality of anchorage elements and a main region; and
a membrane having a perimetral edge and a centroid, said membrane being suspended above said cavity and fixed to said substrate and configured to oscillate through said supporting structure, the plurality of anchorage elements fixed to said membrane, each anchorage element being coupled to a portion of said membrane positioned between the centroid and the perimetral edge of said membrane; and
an electrode coplanar to the main region of the supporting structure, spaced from the membrane by a distance, and electrically and mechanically separate from the main region, the electrode including a plurality of electrode portions mechanically separated from one another.

8. The electronic device of claim 7 wherein said electronic device is one from among: a cell phone, a PDA, a notebook, a voice recorder, an audio player with functionalities of voice recorder, a console for videogames, and a hydrophone.

9. The electronic device of claim 7 wherein said main region is suspended above the cavity and comprises a first anchorage structure fixed to the substrate.

10. The MEMS acoustic transducer of claim 1 wherein the membrane, the support structure, and the anchorage elements are formed of a single material.

11. The MEMS acoustic transducer of claim 10 wherein the single material is doped polysilicon.

12. A MEMS transducer, comprising:
a substrate having a cavity;
a membrane positioned above the cavity, the membrane having a center and a perimeter edge, the membrane including a plurality of spring elements that are coplanar with the membrane;
a trench partially separating the plurality of spring elements from the membrane; and
a supporting structure having a first anchorages coupled to the substrate and second anchorages coupled to the plurality of spring elements at locations between the center and the perimeter edge.

13. The transducer of claim 12, wherein the first anchorages of the supporting structure are coupled to the substrate at locations spaced from the center beyond the perimeter edge.

14. The transducer of claim 12, further comprising a rigid plate coupled to the substrate, the rigid plate having a first part separated from a second part by the supporting structure.

15. The transducer of claim 12 wherein the membrane, the support structure, and the second anchorages are formed of a single material.

16. A MEMS acoustic transducer, comprising:
a substrate having a cavity;
a supporting structure, fixed to the substrate, the supporting structure including a plurality of anchorage elements fixed to the membrane; and
a membrane having a perimeter edge and a center, the membrane being suspended above the cavity and fixed to the substrate, the membrane configured to oscillate through the supporting structure, each anchorage element being coupled to a portion of the membrane positioned between the center and the perimeter edge of the membrane, the membrane including a spring element for each anchorage element, the spring elements being coplanar to the membrane and partially separated from the membrane by a trench.

17. The transducer of claim 16 wherein the plurality of anchorage elements are fixed closer to the center of the membrane than the perimeter edge.

18. The transducer of claim 16 further comprising an electrode coplanar to the main region of the supporting structure, spaced from the membrane by a distance, and electrically and mechanically separate from the main region, the electrode including a plurality of electrode portions mechanically separated from one another.

* * * * *